United States Patent
Ross et al.

[11] Patent Number: 5,796,324
[45] Date of Patent: Aug. 18, 1998

[54] SURFACE MOUNT COIL ASSEMBLY

[75] Inventors: David Alan Ross, Columbiaville; Ronald Kenneth Selby, Burton; Gail Monica Sylvester, Frankenmuth; Victor David Kruppa, Flint, all of Mich.

[73] Assignee: Delco Electronics Corporation, Kokomo, Ind.

[21] Appl. No.: 747,530

[22] Filed: Nov. 12, 1996

[51] Int. Cl.⁶ .............. H01F 27/29; H01F 27/04; H01R 4/00; H01R 4/24
[52] U.S. Cl. .............. 336/192; 336/192; 174/845; 439/397
[58] Field of Search .............. 336/192; 174/845, 174/945; 361/772, 773, 774, 782; 439/888, 577, 387, 397

[56] References Cited

U.S. PATENT DOCUMENTS

| | | | |
|---|---|---|---|
| 4,092,622 | 5/1978 | Widemann et al. | 336/192 |
| 4,251,911 | 2/1981 | Reynolds et al. | 336/192 |
| 5,281,942 | 1/1994 | Stokes | 336/192 |
| 5,351,167 | 9/1994 | Wai et al. | 336/192 |
| 5,570,075 | 10/1996 | Krimmer et al. | 336/192 |

FOREIGN PATENT DOCUMENTS

| | | | |
|---|---|---|---|
| 4114391 A | 5/1992 | Germany | 336/192 |

OTHER PUBLICATIONS

Dickens et al, Improved Coil Bobbin, ATT Technologies, Technical Digest No. 76, Mar. 1995.

*Primary Examiner*—Michael L. Gellner
*Assistant Examiner*—Anh Mai
*Attorney, Agent, or Firm*—Jimmy L. Funke

[57] ABSTRACT

A coil is wound on a bobbin having posts extending from the bobbin body, the end of the coil wire being wrapped on the posts to form wire terminations. The coil is mounted on a circuit board with the coil either above the board or suspended alongside the board edge. The periphery of each post is positioned against a solder pad of the circuit board and the wire termination is soldered to the pad. Each post has a flexible neck portion to relieve stress due to coil thermal expansion. A recess in the side of the post facing the solder pad enhances solder interaction with the wire termination.

9 Claims, 1 Drawing Sheet

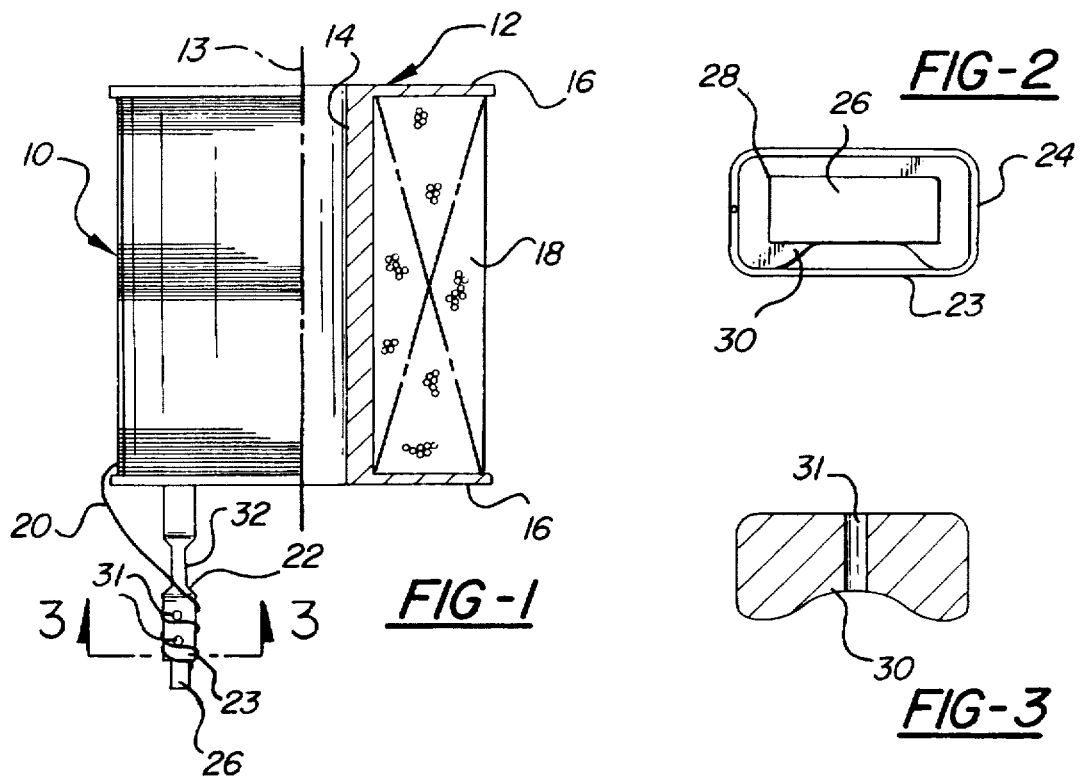

5,796,324

1

SURFACE MOUNT COIL ASSEMBLY

FIELD OF THE INVENTION

This invention relates to a coil mounted directly to a circuit board and particularly to coil apparatus for a surface mount configuration and a coil and circuit board assembly.

BACKGROUND OF THE INVENTION

Electrical devices often require coils to be mounted to a circuit board to serve as a motor winding, a choke coil or an antenna, for example. Typically such coils include a bobbin carrying terminal pins and a wire winding on the bobbin terminating on the pins. The coil is then attached to a circuit board by inserting the pins into holes in the board and making solder connections. Other designs have coils wound on a bobbin with no terminal pins; the wire ends are free and are difficult to locate for soldering.

In the case of other components such as resistors it is known to use surface mount attachment configurations wherein terminal pins and holes in the board are not necessary; rather the component has terminals which are directly soldered to surface pads on the board, usually by reflow soldering. It is desirable to treat coils in the same manner to lower coil cost and improve the ease of assembly. It is also desirable to mount coils in positions not readily accomplished with conventional terminal pin coil configurations.

SUMMARY OF THE INVENTION

It is therefore an object of the invention to configure a coil for surface mounting to a circuit board. It is another object to afford an assembly of such a coil with a circuit board.

A plastic coil bobbin has extensions protruding from a body, and a coil wound on the body has wire terminations wrapped on the extensions. The extensions each have a periphery for direct contact with a solder pad of a circuit board so that the wire terminations are easily soldered to the pad by reflow soldering or other soldering techniques. The extension has a flexible neck portion between the bobbin body and the wire terminations to accommodate thermally induced changes in the body without stressing the solder connection. Optionally, the peripheral portion of each extension has a recess facing the solder pad to enhance the solder flow around the wire.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a partially sectioned side view of a coil assembly according to the invention;

FIG. 2 is a end view of a coil terminal;

FIG. 3 is a cross section of a coil terminal taken along line 3—3 of FIG. 1; .

FIG. 4 is a side view of a coil assembly mounted on a circuit board according to the invention; and FIG. 5 is a partially sectioned side view of a transformer according to a second embodiment of the invention;

DESCRIPTION OF THE INVENTION

While the ensuing description is directed to a surface mount coil and coil assembly specifically designed for a field coil of a stepper motor and to a transformer, it should be recognized that such a coil mounting arrangement according to the invention is also useful for other coil types for mounting on a circuit board. Some examples of such other coil types are servo coils, relays, inductor coils, inductive sensors and antenna coils.

Referring to FIG. 1, a coil 10 comprises a plastic bobbin 12 having a body defining an axis 13 and including a central hollow spool member 14 with a pair of end flanges 16. A wire winding 18 is wound on the spool and has ends 20. To terminate each winding end 20 the bobbin includes an extension or post 22 which protrudes in the axial direction from one of the end flanges 16. The ends 20 are wrapped on the posts to become wire terminations 23. As seen in FIGS. 2 and 3, the post has a rectangular cross section with rounded corners 24. A rectangular tip 26 on each post 22 has sharp 90° corners 28 which are used to break the wire after coil winding is complete. The tip 26 could be triangular to present different angles at the corners, or some other configuration could present a sharp edge to break the wire.

The periphery of the post 22 has one face which will contact a circuit board upon assembly. An optional longitudinal concave depression 30 in that face, as shown in FIGS. 2 and 3, will be somewhat spaced from the board and allows solder to readily interact with the wire termination 23 which bridges the depression. Small holes 31 through the post allow the escape of flux gases generated during reflow soldering. Even in the absence of the concave depression 30, strength in the solder joint is afforded by a solder fillet adjacent each side of the post. The post 22 has a flexible reduced neck portion 32 near the flange 16 to permit some movement between the bobbin body and the wire termination, thereby preventing solder joint stress when such movement occurs due to thermal expansion, for example.

In the manufacture of a coil, a coil winding machine applies the coil to the bobbin and wraps the wire around the post to form the termination, and then breaks the wire by pulling it against a sharp corner 28 of the tip 26 to complete the winding operation. The rounded corners 24 of the post 22 prevent wire breakage at that point. The coil wire, of course, is insulated. The insulation is removed from the terminations 23 by immersing the posts in a chemical stripping agent or in hot solder which vaporizes the insulation and tins the wire. Alternatively, the insulation is left in place until the termination is soldered to a circuit board. Then during soldering heat is applied locally to the termination 23 to remove the solder, the remainder of the coil being shielded from the high temperature. The bobbin and post are molded of high temperature resins which withstand normal soldering processes.

FIG. 4 shows a coil and circuit board assembly adapted for a stepper motor application. The coil 10 surrounds a steel core 34 which is attached to a circuit board 36 such that part of the core 34 extends beyond the edge of the circuit board. The coil 10 is positioned at the edge of the board 36 such that the plane of the board intersects the bobbin body and the posts 22 extend across the margin of the board such that the wire terminations 23 lie against a solder pad 38 on the circuit board. During assembly a solder paste is applied to the pad and a joint is formed by reflow soldering.

In another embodiment, shown in FIG. 5, a transformer 40 has a plastic housing or bobbin 42 defining an axis 43 and containing wound coils 44. The housing has lateral extensions 46 and a coil end is wrapped around each extension to form wire terminations 48. The extensions 46 have the same configuration as those of FIGS. 2 and 3; a flexible neck portion, though not shown, may be included as well as the recess in the periphery of the extension. A circuit board 50 has solder pads 52 corresponding to the terminations. The transformer 40 is mounted atop the circuit board 50 with the terminations 48 on the pads 52, and bonded to the pads by solder joints.

It will thus be seen that the surface mount coil configuration applies to coils of various kinds and in any case allows easy assembly to a circuit board and freedom from stress in the solder joint due to thermal expansion of the coil. The coil does not require separate terminal pins and thus is economical to make, using only two parts, a bobbin and the wire.

The embodiments of the invention in which an exclusive property or privilege is claimed are defined as follows:

1. A coil adapted for mounting on a circuit board having solder pads comprising:

a plastic bobbin having a body and a plurality of extensions protruding from the body;

each extension having a periphery adapted for contact with a solder pad of the circuit board;

a winding on the bobbin having wire terminations wrapped around the peripheries of the extensions for connection to the solder pads; and the periphery of each extension has a recess bridged by the wire termination to facilitate solder flow around the wire.

2. The invention as defined in claim 1 wherein each extension has a generally rectangular cross section with rounded corners to prevent breaking the wire termination.

3. The invention as defined in claim 1 wherein:

each extension has a generally rectangular cross section with rounded corners to prevent breaking the wire termination; and a tip on each extension has at least one corner sufficiently sharp to facilitate breaking off wire at the conclusion of coil winding.

4. The invention as defined in claim 1 wherein:

the recess comprises a longitudinal concave recess adapted to face the solder pad upon assembly to facilitate solder interaction between the wire and the board.

5. The invention as defined in claim 1 wherein the body defines an axis and the extensions protrude axially from the body.

6. The invention as defined in claim 1 wherein the body defines an axis for disposition normal to the circuit board and the extensions protrude laterally with respect to the axis.

7. A surface mount coil assembly comprising:

a circuit board having solder pads;

a coil including a plastic bobbin having a body and a plurality of extensions protruding from the body;

each extension having a periphery in contact with a solder pad on the circuit board;

a winding on the bobbin having wire terminations wrapped around the peripheries of the extensions;

the periphery of each extension having a recess bridged by the wire termination to facilitate solder flow around the wire; and solder joints bonding the wire terminations to the solder pads.

8. The invention as defined in claim 7 wherein:

the solder pads are arranged along an edge of the circuit board;

the body being adjacent the edge of the circuit board and transverse of the plane of the circuit board; and the extensions extending parallel to the circuit board.

9. The invention as defined in claim 7 wherein:

the body defines an axis normal to the plane of the circuit board; and the extensions protrude laterally on opposite sides of the axis for contact with the solder pads.

* * * * *